US007935463B2

(12) United States Patent
Kazmaier et al.

(10) Patent No.: US 7,935,463 B2
(45) Date of Patent: May 3, 2011

(54) REUSABLE PAPER MEDIA WITH COMPATIBILITY MARKINGS AND PRINTER WITH INCOMPATIBLE MEDIA SENSOR

(75) Inventors: Peter M. Kazmaier, Mississauga (CA); Sophie V. Vandebroek, Penfield, NY (US); Eric J. Shrader, Belmont, CA (US); Gabriel Iftime, Mississauga (CA); Chuck Sperling, Richmond Hill (CA); Lauren Barclay, Orangeville (CA)

(73) Assignees: Xerox Corporation, Norwalk, CT (US); Palo Alto Research Center Incorporated, Palo Alto, CA (US)

( * ) Notice: Subject to any disclaimer, the term of this patent is extended or adjusted under 35 U.S.C. 154(b) by 80 days.

(21) Appl. No.: 12/400,147

(22) Filed: Mar. 9, 2009

(65) Prior Publication Data

US 2010/0227270 A1 Sep. 9, 2010

(51) Int. Cl.
*G03F 7/00* (2006.01)
*G03F 7/004* (2006.01)

(52) U.S. Cl. .................. 430/19; 430/270.1; 430/270.15; 430/9; 430/945

(58) Field of Classification Search .................... 430/19, 430/270.1, 270.15, 945, 9
See application file for complete search history.

(56) References Cited

U.S. PATENT DOCUMENTS 5,438,928 A * 8/1995 Chatwin et al. ............... 101/369
6,293,668 B1 9/2001 Kubby et al.
6,541,100 B1 * 4/2003 Williams et al. ........... 428/195.1
7,256,921 B2 * 8/2007 Kumar et al. ................. 359/241
7,300,727 B2 * 11/2007 Kazmaier et al. ............... 430/19
2005/0244742 A1 11/2005 Iftime et al.
2005/0244743 A1 11/2005 Iftime et al.
2005/0244744 A1 11/2005 Kazmaier et al.
2006/0072139 A1 4/2006 Hult et al.
2007/0119951 A1 * 5/2007 Auslander et al. ............ 235/491
2007/0140775 A1 6/2007 Shrader
2008/0110995 A1 * 5/2008 Iftime et al. .................. 235/491
2008/0191136 A1 8/2008 Shrader et al.
2008/0310869 A1 12/2008 Iftime et al.

OTHER PUBLICATIONS

U.S. Appl. No. 11/873,213 to Iftime filed Oct. 16, 2007.
U.S. Appl. No. 12/206,136 to Iftime filed Sep. 8, 2008.
Co-pending U.S. Patent Appl. No. filed concurrently herewith.

* cited by examiner

*Primary Examiner* — Amanda C. Walke
(74) *Attorney, Agent, or Firm* — Oliff & Berridge, PLC

(57) ABSTRACT

A reusable image forming medium, including a substrate; an imaging layer coated on or impregnated into the substrate, wherein an irradiation of the imaging layer produces an image; and a signature material coated on or impregnated into the substrate or the imaging layer, the signature material being detectable by a sensor.

8 Claims, 2 Drawing Sheets

REUSABLE PAPER MEDIA WITH COMPATIBILITY MARKINGS AND PRINTER WITH INCOMPATIBLE MEDIA SENSOR

TECHNICAL FIELD

This disclosure is generally directed to a substrate, method, and apparatus for forming images, using an inkless printer, on compatible media that contains a signature material. More particularly, the compatible media is an inkless printing substrate that includes a signature material that is detectable by a sensor for determining whether the media is compatible with the inkless printer. In embodiments, this disclosure is directed to inkless printing substrates including the signature material, such as inkless printing paper utilizing, as the signature material, a composition that is detectable upon exposure to UV light, which composition can be dispersed in a polymer as a dry coating onto or into the substrate. Other embodiments are directed to inkless printing methods using the inkless printing substrates containing the signature material, and apparatus and systems for such printing.

CROSS-REFERENCE TO RELATED APPLICATIONS

Imaging techniques employing photochromic materials, that is materials which undergo reversible or irreversible photoinduced color changes, are known. For example, U.S. Pat. No. 3,961,948 discloses an imaging method based upon visible light induced changes in a photochromic imaging layer containing a dispersion of at least one photochromic material in an organic film forming binder. Other known photochromic materials can be found in U.S. Patent Application Publication No. 2005/0244742 filed Apr. 29, 2004; U.S. Patent Application Publication No. 2005/0244743 filed Apr. 29, 2004; U.S. Patent Application Publication No. 2005/0244744 filed Apr. 29, 2004 and U.S. patent application Ser. No. 12/206,136 filed Sep. 8, 2008, the disclosures of which are incorporated by reference in their entireties.

These and other photochromic (or reimageable or electric) papers are desirable because they can provide imaging media that can be reused many times, to transiently store images and documents. For example, applications for photochromic based media include reimageable documents such as, for example, electronic paper documents. Reimageable documents allow information to be kept for as long as the user wants, then the information can be erased or the reimageable document can be re-imaged using an imaging system with different information.

Transient document printers are known, for example, in U.S. patent application Ser. No. 11/762,327 filed Jun. 13, 2007, U.S. Patent Application Publication No. 2008/0191136 filed Feb. 13, 2007 and U.S. patent application Ser. No. 12/400,148 filed Mar. 9, 2009, the disclosures of each of which are incorporated by reference in their entireties.

BACKGROUND

To address concerns regarding inkjet printers, inkless printing using inkless printing paper and substrates (reusable media) has been developed. Reusable media is inkless printable media that can be imaged, erased, and reimaged a multitude of times, thereby eliminating the need to print an image on a new sheet every time a user prints a new image. However, because reusable media is very similar to traditional paper in look and feel, there is significant risk that a user will inadvertently mix regular ink-printable paper with reusable media in an inkless printer input tray.

Unexpected print failures may occur if the wrong media type ends up in a media feed tray of an inkless printer. Users may then become frustrated and disappointed in print results and wrongly attribute the poor print quality or print errors to the printer itself, rather than to the erroneously mixed media. In this situation, a user may continue to resubmit a print job to the printer until a satisfactory print occurs on the correct media type, or at best, would have to resubmit the print job once the problem becomes apparent. Therefore, large quantities of paper and time may be wasted and increase the printing expense.

SUMMARY

The present disclosure addresses these and other needs, by providing a reusable image forming medium utilizing a composition that is imageable by UV light, heat, infrared, ultrasound or other known methods of inkless printing of paper. In addition, the reusable media contains a visible or invisible signature material that can be detected by a sensor. The signature material is detectable by a sensor that is incorporated into the inkless printer device, thus determining whether the paper is reusable media or regular paper media. In this way, printing errors are avoided by feeding incompatible media to a separate media tray, and printing of the reusable media on the next available reusable media is performed.

Described herein is a reusable image forming medium, comprising:

a substrate;

an imaging layer coated on or impregnated into the substrate, wherein an irradiation of the imaging layer produces an image; and a signature material coated on or impregnated into the substrate or the imaging layer, the signature material being detectable by a sensor.

Further described is a system for printing an image to a reusable image forming medium, the system comprising:

- an input tray that holds image forming media including the reusable image forming medium;
- an inkless printer device for inkless printing of the reusable image forming medium;
- a transport path that transports the image forming medium from the input tray;
- a sensor disposed along the transport path and before an image forming source of the inkless printer device, the sensor capable of sensing the presence or absence of a signature material on the image forming medium, and outputting a signal; and
- a deciding unit that decides, based on the signal output from the sensor, whether to cause the inkless printer to print the image on the image forming medium fed past the sensor.

In another aspect, the present disclosure provides a method of producing an image on an reusable image forming medium, the method comprising:

- providing a reusable image forming medium;
- marking the reusable image forming medium with a signature material, the signature material being detectable by a sensor,
- scanning the marked reusable image forming medium with the sensor, the sensor providing an output, the output indicating whether the signature material is detected;
- determining whether to print an image on the image forming medium based on the output of the sensor, wherein the image is printed on the image forming medium if the signature material is detected.

DETAILED DESCRIPTION

Figure 1:
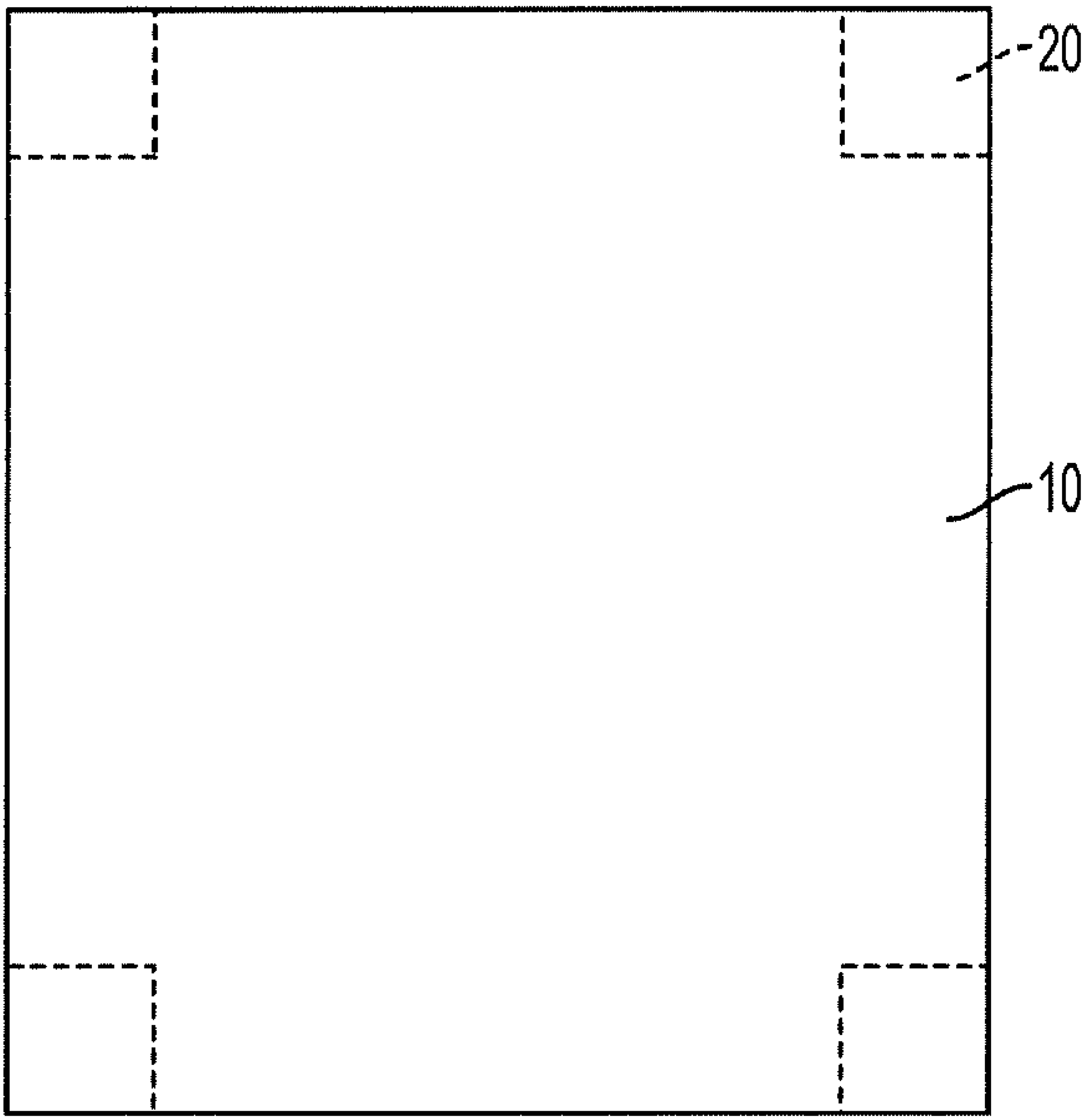
FIG. 1 illustrates a reusable image forming medium having signature material disposed thereon.

The present disclosure provides a printing media, method, and printer system for printing images without using ink or toner and separating reusable printing media from incompatible paper media. The reusable printing media has a special imageable composition and it is "printed" (that is, an image is formed on the reusable media) without ink or toner, for example by forming the image with the use of UV light, and the reusable media further includes a signature material. The reusable media thus allows image formation using a printer that does not require ink or toner replacement, and instead images the paper, for example, by using a UV light source, such as a LED, when the printer detects the signature material.

As reusable media, any known or future developed re-imageable media may be used.

Details of the embodiments will be described with reference to the drawing Figures.

Generally, in various exemplary embodiments as shown in FIG. 1, there is provided an inkless paper or image forming medium 10 formed using a composition that is imageable without ink, such as using UV light. The inkless paper or image forming medium 10 is further provided with a signature material 20 for indicating that the inkless paper or image forming medium 10 is compatible with an inkless printer, for example a UV light printer.

The image forming medium may comprise a supporting substrate, coated or impregnated on at least one side with the imaging layer. As desired, the substrate can be coated or impregnated on either only one side, or on both sides, with the imaging layer. When the imaging layer is coated or impregnated on both sides, or when higher visibility of the image is desired, an opaque layer may be included between the supporting substrate and the imaging layer(s) or on the opposite side of the supporting substrate from the coated imaging layer. Thus, for example, if a one-sided image forming medium is desired, the image forming medium may include a supporting substrate, coated or impregnated on one side with the imaging layer and coated on the other side with an opaque layer such as, for example, a white layer. Also, the image forming medium may include a supporting substrate, coated or impregnated on one side with the imaging layer and with an opaque layer between the substrate and the imaging layer. If a two-sided image forming medium is desired, then the image forming medium may include a supporting substrate, coated or impregnated on both sides with the imaging layer, and with at least one opaque layer interposed between the two coated imaging layers. Of course, an opaque supporting substrate, such as conventional paper, may be used in place of a separate supporting substrate and opaque layer, if desired.

Any suitable supporting substrate may be used. For example, suitable examples of supporting substrates include: glass, ceramics, wood, plastics, paper, fabrics, textile products, polymeric films, inorganic substrates such as metals, and the like. The plastic may be for example a plastic film, such as polyethylene film, polyethylene terephthalate, polyethylene naphthalate, polystyrene, polycarbonate, polyethersulfone. The paper may be, for example, plain paper such as XEROX® 4024 paper, ruled notebook paper, bond paper, silica coated papers such as Sharp Company silica coated paper, Jujo paper, and the like. The substrate may be a single layer or multi-layer where each layer is the same or different material. The substrate may have a thickness ranging for example from about 0.3 mm to about 5 mm, although smaller or greater thicknesses can be used, if desired.

In embodiments, the image forming medium generally comprises an imaging layer coated on or impregnated in a suitable substrate material, or sandwiched between a first and a second substrate material, and a signature material that is either visible or invisible that is coated on or impregnated into the substrate material.

The imaging layer can include any suitable material that, when exposed to an activating energy such as ultraviolet light, switches from a first clear state to a second colored state. The color state change in embodiments can be reversed, and thus the image "erased" and the image forming medium returned to a blank state, by various means such as heating the composition to a temperature that reverses the image forming reaction, thus returning the material to its clear state.

The signature material may be any suitable material that can be coated on or impregnated into the substrate material and provide an optical or spectral response. The signature material may be visible or invisible to the naked eye. The signature material is detectable by a sensor, and thus a device can confirm (by detecting the signature material) that the correct media type is available for inkless printing. In this way, printing errors can be avoided by, rejecting incompatible media, if incompatible media (such as regular paper) was inadvertently loaded into the media feed tray.

The signature materials may be disposed on the image forming medium so as not to occupy portions of the image forming medium that are to be imaged. The signature materials may also be disposed on the image forming medium so as to occupy portions of the image forming medium that are to be imaged. The signature material therefore does not necessarily affect the print quality of the image forming medium, and may thus be imaged over without affecting the signature material or the quality of the image.

It is desired that the signature material does not occupy portions of the image forming medium that are to be imaged. In this regard, the signature material is typically disposed on the image forming medium on portions of the outside edge of the medium, in the margins of the medium or the corners of the medium.

The signature material may be disposed in symmetrical or non-symmetrical patterns on the image forming medium. The signature may be formed to occupy entire regions of one or more edges of the image forming medium, such as four corners of the image forming medium or four edges of the image forming medium.

Because the image forming medium may be imageable on both or all sides of the medium, the image forming medium preferably has signature material disposed on both or all sides of the image forming medium.

It is desired that the signature material be disposed on both or all sides of the image forming medium in a symmetrical pattern. This provides the benefit, for example, that no matter how the image forming medium is inserted into an inkless printer input tray, the signature material will be in a position that is detectable by a sensor. FIG. 1 illustrates a signature material disposed in each corner of a side of reusable media.

The size of the signature material on the image forming medium may vary. Various shapes and sizes of signature material markings may be disposed on the image forming medium. For example, a signature material marking may be as small as 1 micron in size or larger. The signature material size may also be as small as 3 millimeters in size or larger. Smaller size signature material markings may require higher fidelity sensors and/or higher powered illumination devices to produce a spectral response capable of being detected.

Any suitable visible signature material can be used, where the signature material is visible to the human eye under ambient light. Various visible signature materials, such as colored or black inks, dyes, toners, chromophore functionalized polymers and the like may be used.

Visible signature materials can be detected by sensors tuned to the particular spectral response of the visible signature material. In addition, the visible signature material could further contain invisible fluorescent material to be detected by sensors tuned to the spectral response of the invisible fluorescent material.

The signature material may also be generally referred to as a "green" marking. As such, the green marking indicates to an individual that the marked paper is reusable paper and is environmentally friendly or "green". In this regard, a visible green marking provides the additional benefit of indicating to bystanders that the individual using the reusable paper is environmentally conscious.

Invisible signature materials may also be used. By invisible, it is intended that the material is substantially not seen by a naked human eye under ambient light conditions. The material may be made detectable by a sensor upon exposure to an activating radiation, for example may be made to fluoresce for a detectible period of time, by exposure to UV light, and a sensor can then detect the material or the spectral response of the material.

Any suitable invisible signature material can also be used in conjunction with, or separately from visible signature materials. Various invisible signature materials that may be used include fluorescent dyes, fluorescent pigments, quantum dots, fluorescence functionalized polymers and the like may be used.

Suitable fluorescent inks are commercially available, for example, the IF2 series from Risk Reactor. The IF2 series from Risk Reactor may emit red, green, yellow, blue or any other desired bright color when exposed to UV light. Detection may be accomplished using a long wavelength 300 nanometer Entela UVGL-25 4 Watt UV lamp. Additionally, UV light emitting diodes LEDs in the 350 to 410 nm range are also available from several sources, Nichia for example, and can also be used in this application.

The signature material may be applied to the image forming medium at the time of manufacturing the medium or after the manufacturing of the medium. The signature material may be applied to the image forming medium in using any suitable means for applying a material to a image forming medium. Various methods of applying the signature material to an image forming medium include, for example, inkjet printing, flexographic printing, xerographic printing, offset printing, coating methods, adding a special adhesive patch and other printing or coating methods.

The signature material may be applied to the substrate itself. Alternatively, the signature material can be applied over the image forming layer of the substrate.

The signature material may be any color. It may be desirable that the visible signature material exhibit a green color because green is traditionally associated with environmental friendliness. Thus, the green color could be used to additionally indicate that the reusable paper is environmentally friendly. It may also be desirable that the invisible signature material, such as a invisible fluorescent material, exhibit a green color when exposed to UV or other light sources. Thus, when the invisible signature material fluoresces, an individual would notice that the paper was environmentally friendly, or "green". In other instances, the signature material may only fluoresce briefly in the device, and the user may never see the fluorescent response.

The signature material may be selected based on particular optical characteristics that are desired, for example, emission wavelength and frequency. The sensors present in the system can be tuned to detect the specific optical characteristics of the signature material. Thus, different signature materials can be used to mark different types of image forming media. It may thus be appreciated that different particular signature materials be used for different types of image forming media, thus indicating individual image forming medias compatibility with corresponding inkless printing systems.

The signature material may desirably be a material that is permanent. For example, a material that lasts as long or longer than the life of the image forming media it is disposed on. However, it may be desired in some instances to have a signature material that is non-permanent and dissipates in a time period that is shorter than the life of the image forming medium.

Figure 2:
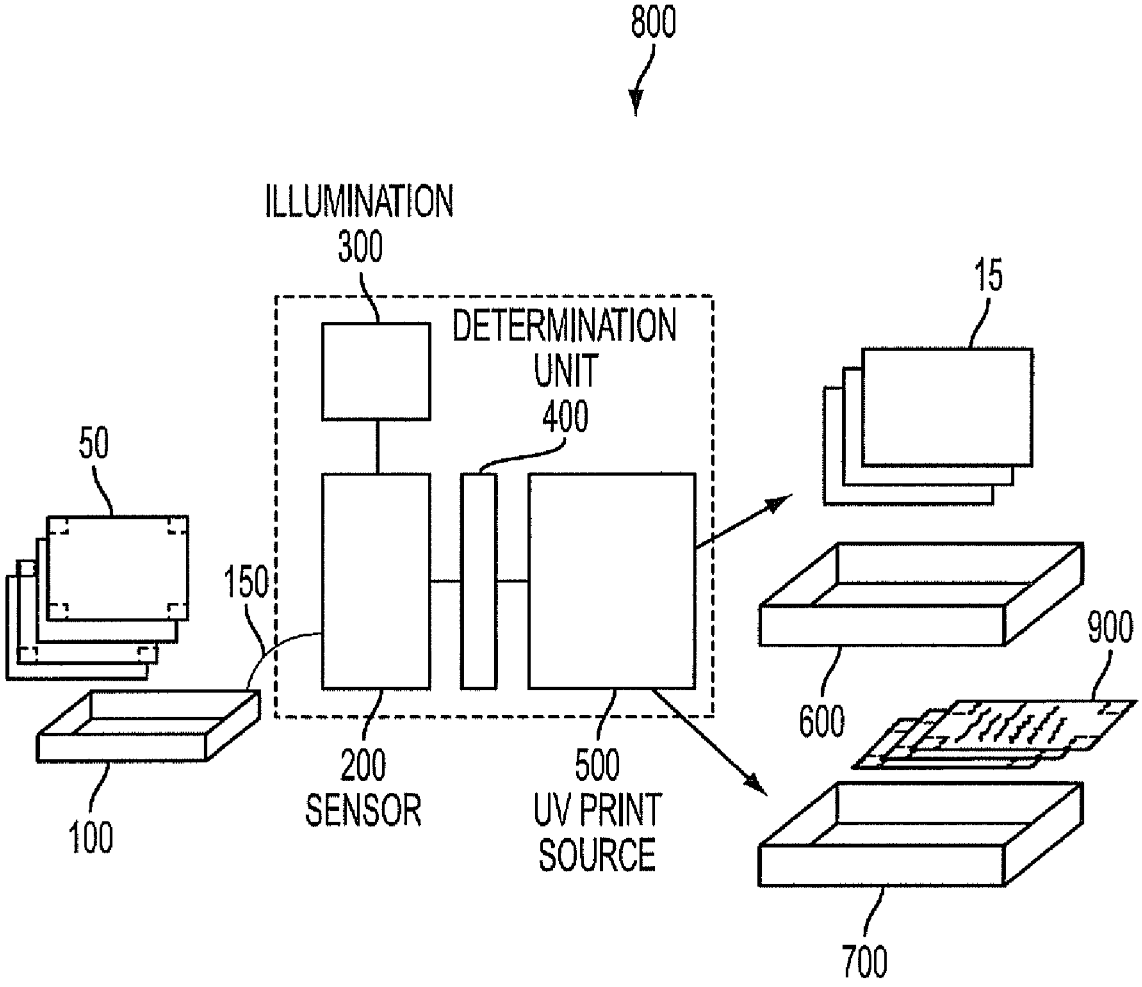
FIG. 2 illustrates a system for printing an image to a reusable image forming medium containing the signature material.

In another embodiment, the present disclosure provides a system for printing an image to a compatible reusable image forming medium 10 (FIG. 1 only), the system comprising:

- an inkless printer device 800 for inkless printing of compatible reusable image forming medium 10;
- an input tray 100 holding a plurality media 50, due to size similarities, media 50 in tray 100 may be compatible reusable media 10 or other media that should not be fed to the device 800, lest it cause print malfunctions;
- a compatible reusable image forming medium 10 for being imaged by the inkless printer device;
- a transport path 150 that transports the media from tray 100 towards device 800;
- a sensor 200 located in transport path 150 and before device 800 that senses whether a signature material 20 is present on the fed media 50 and outputs a signal; and
- a deciding unit 400 that decides, based on the signal output from the sensor 200, whether the fed media 50 is compatible reusable media 10 or incompatible media 15,
- wherein if the sensor senses the signature material 20, the compatible reusable media 10 is fed along path 150 to exposure source 500 for imaging, and imaged compatible media 900 is output to tray 700, and
- if the signature material is not sensed by the sensor the incompatible media 15 is transported to bypass exposure source 500 and is output to tray 600 without being imaged. (See FIG. 2)

In embodiments, rather than bypass the imaging source 500, the media 50 may be fed through the device past the imaging source 500, but not subjected to printing, and thus simply pass to the output tray. A message indicating a fault or error may be provided to the user so the user understands the reason for the non-printing. The printer may then print on the next compatible reusable media sheet that is detected.

The sensor 200 can be any known optical sensor capable of detecting a spectral response of a signature material 20. Suitable optical sensors include photoelectric cells, filtered silicon photodetectors, charge coupled device (CCD) line or area scan detectors or color CCD cameras.

The sensor 200 thus attempts to detect the signature material 20 as the media 50 passes by the sensor. If the sensor 200 detects the signature material 20, the sensor outputs a signal, to the deciding unit 400, that the media 50 passing through the inkless printer device 800 is indeed compatible with the inkless printer.

After sensing the signature material 20, the media having the signature material thereon is considered compatible reusable media 10 for use with the inkless printing system. The printer will then proceed to print an image on the image forming medium 10 using an inkless printing method, such as the application of UV light to the image forming medium using a UV light print source 500. After the image is formed on the image forming medium 10, the imaged compatible media 900 is sent to an output tray 700 that is designated for imaged compatible media 900.

If the signature material 20 is not detected by the sensor, the sensor outputs a signal to the determining unit indicating that the media is considered to be incompatible media 15 for the inkless printing system 800. The system, in this instance, will not attempt to print an image on the incompatible media 15. The incompatible media then bypasses exposure unit 500 and sent to an output tray 600 designated to be for incompatible media 15. Thus, the incompatible media 15 is separated from the imaged compatible media 900. In this regard, print jams and print failures normally caused by incompatible media are avoided.

If desired, a further overcoating layer may also be applied over the applied imaging layer and/or the signature material. The further overcoating layer may, for example, be applied to further adhere the underlying layer in place over the substrate, to provide wear resistance, to improve appearance and feel, and the like. The overcoating layer can be the same as or different from the substrate material. For example, at least one of the overcoating layer and substrate layer is clear and transparent to permit visualization of the formed image.

In embodiments where the imaging material is coated on or impregnated into the substrate, the coating can be conducted by any suitable method available in the art, and the coating method is not particularly limited. For example, the imaging material can be coated on or impregnated into the substrate by dip coating the substrate into a solution of the imaging material composition followed by any necessary drying, or the substrate can be coated with the imaging composition to form a layer thereof. Similarly, the protective coating can be applied by similar methods.

In the method herein, the present disclosure involves producing an image on a reusable image forming medium, the method comprising:

providing a plurality of media;

feeding each of the plurality of media by a sensor;

scanning the fed media with the sensor, the sensor providing an output, the output indicating whether a signature material is detected on the fed media;

determining whether to print an image on the fed media based on the output of the sensor, wherein the image is produced on the media by an inkless printer if the signature material is detected on the fed media, and wherein if the signature material is not detected, indicating that the image forming medium is not compatible, an image is not produced on the media by an inkless printer.

In embodiments, the exposure source used to form the transient image may also be used to illuminate the signature material. For example, UV LEDs may be used to illuminate an invisible fluorescent signature material. After illumination by the UV light source the invisible fluorescent material will fluoresce and provide a specific spectral response that is detectable by the sensor in the printing system.

It is further appreciated that the image forming media having a signature material could be used in conjunction with a dual-use printer. For example, a dual-use printer such as a printer having both a UV printhead and an inkjet printhead could be used. The feed tray corresponding to the dual-use printer could contain a mixture of media, including reusable media and regular paper. In this instance, the dual-use printer could be used to detect whether a signature material is present, as on compatible reusable media, or whether no signature material is present as on regular paper. Based on the presence of the signature material, a deciding unit could determine which transport path the media should follow. One media path of the dual-use printer would transport the media to a inkless printhead if the signature material is detected, and if the sensor does not detect the signature material the media would be sent along an alternate transport path so as to be fed to an inkjet printhead.

What is claimed is:

1. A reusable image forming medium, comprising a substrate;

an imaging layer coated on or impregnated into the substrate, wherein an irradiation of the imaging layer produces an image;

wherein an exposure to an activating energy switches an exposed portion of the imaging layer from a first clear state to a second colored state, and wherein the exposed portions of the imaging layer are capable of returning to the first clear state based upon a predetermined condition, and a signature material that indicates a compatibility with a predetermined printing device coated on or impregnated into the substrate or the imaging layer, the signature material being detectable by a sensor.

2. The image forming medium of claim 1, wherein the substrate is selected from the group consisting of glass, ceramic, wood, plastic, paper, fabric, textile, metals, plain paper, and coated paper.

3. The image forming medium of claim 1, wherein the signature material is visible under ambient light.

4. The image forming medium of claim 1, wherein the signature material is a fluorescent material substantially invisible under ambient light.

5. The image forming medium of claim 1, wherein the signature material is disposed in a symmetrical pattern that covers at least a portion of the outer periphery of the image forming medium.

6. The image forming medium of claim 4, wherein the signature material is disposed in a symmetrical pattern that covers at least a portion of the outer periphery of the image forming medium.

7. The image forming medium of claim 6, wherein the symmetrical pattern is disposed on all sides of the image forming medium.

8. The image forming medium of claim 7, wherein the symmetrical pattern is disposed on the image forming medium such that at least a portion of the signature material will pass under the sensor, regardless of an orientation of the image forming medium.

* * * * *